(12) United States Patent
Sugimoto et al.

(10) Patent No.: US 7,123,136 B2
(45) Date of Patent: Oct. 17, 2006

(54) INDICATOR SYSTEM HAVING MULTIPLE LEDS

(75) Inventors: Shigekazu Sugimoto, Takahama (JP); Yoshichika Abe, Anjo (JP)

(73) Assignees: Anden Co., Ltd., Anjo (JP); Denso Corporation, Kariya (JP)

( * ) Notice: Subject to any disclaimer, the term of this patent is extended or adjusted under 35 U.S.C. 154(b) by 197 days.

(21) Appl. No.: 10/952,778

(22) Filed: Sep. 30, 2004

(65) Prior Publication Data

US 2005/0073428 A1    Apr. 7, 2005

(30) Foreign Application Priority Data

Oct. 6, 2003  (JP) ............................ 2003-347092
Oct. 6, 2003  (JP) ............................ 2003-347093

(51) Int. Cl.
*B60Q 1/26* (2006.01)

(52) U.S. Cl. ................. 340/468; 340/657; 340/815.45; 315/77; 362/545

(58) Field of Classification Search ........... 340/815.45, 340/462
See application file for complete search history.

(56) References Cited

U.S. PATENT DOCUMENTS

| | | | | |
|---|---|---|---|---|
| 4,291,302 A | * | 9/1981 | King et al. ................. | 340/642 |
| 4,866,390 A | * | 9/1989 | Butchko ..................... | 324/504 |
| 5,309,143 A | * | 5/1994 | Brown et al. ............... | 340/475 |
| 5,955,945 A | * | 9/1999 | Fuhrer ........................ | 340/479 |
| 6,243,009 B1 | * | 6/2001 | Fritz et al. .................. | 340/471 |
| 6,535,113 B1 | * | 3/2003 | Gravolin .................... | 340/431 |
| 6,844,681 B1 | * | 1/2005 | Serizawa et al. ............ | 315/77 |
| 6,927,683 B1 | * | 8/2005 | Sugimoto et al. .......... | 340/475 |

FOREIGN PATENT DOCUMENTS

JP    A-2002-076439    3/2002

* cited by examiner

*Primary Examiner*—Daniel Wu
*Assistant Examiner*—George Bugg
(74) *Attorney, Agent, or Firm*—Posz Law Group, PLC (57) ABSTRACT

An indicator system having light emitting diode (LED) indicators and an open-circuit detecting circuit. In the open-circuit detecting circuit, a voltage at a point between a constant current source and the first resistor is applied to a base of a transistor. The second resistor is connected in parallel between the base and an emitter of the transistor. The third and the fourth resistors are connected in series between the constant current source and a collector of the transistor. The fifth resistor is connected between the emitter of the transistor and the first resistor. The threshold determining circuit determines a voltage at a point between the third and the fourth resistors as a threshold voltage. With this configuration, the threshold voltage can be adjusted according to the resistance of the first resistor.

10 Claims, 8 Drawing Sheets

INDICATOR SYSTEM HAVING MULTIPLE LEDS

CROSS REFERENCE TO RELATED APPLICATION

This application is based on and incorporates herein by reference Japanese Patent Applications No. 2003-347092 and No. 2003-347093 both filed on Oct. 6, 2003.

FIELD OF THE INVENTION

The present invention relates to an indicator system having multiple LEDs and an open-circuit detecting function for detecting disconnections in LED lines.

BACKGROUND OF THE INVENTION

Figure 11:
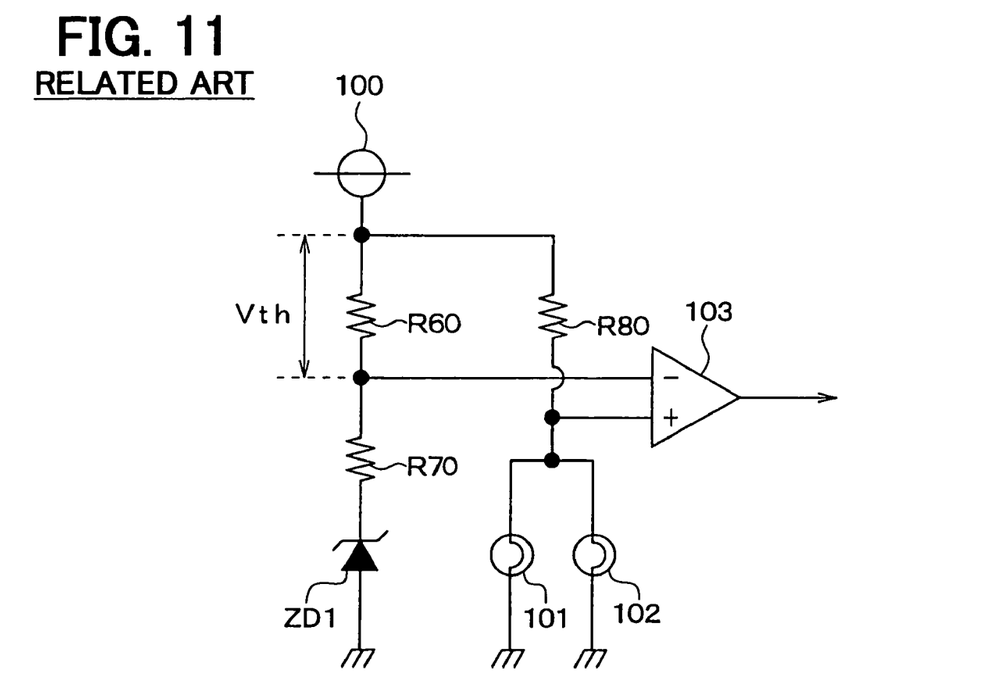
FIG. 11 is a circuit diagram of an indicator system according to a related art.

An indicator system for a vehicle is shown in FIG. 11. This system includes an indicator unit having an open-circuit detecting function. A partial voltage of a voltage $V_B$ of a battery 100 divided by resistors R60, R70 and a zener diode ZD1 is determined as a threshold voltage $V_{th}$ for the open-circuit detection. A shunt resistor R80 is connected between the battery 100 and incandescent lamps 101, 102 that are arranged at the front end and the rear end of the vehicle.

A comparator 103 is provided for comparing a voltage drop $V_{R80}$ at the shunt resistor R80 with the threshold voltage $V_{th}$. When an open-circuit is present, that is, a disconnection is present, in at least one of the incandescent lamps 101, 102, a current flowing through the shunt resistor R80 is reduced. As a result, the voltage drop VR80 at the shunt resistor R80, namely, a voltage at a point between the shunt resistor R80 and the incandescent lamps 101, 102, becomes smaller. An output level of the comparator 103 varies when the incandescent lamp 101, 102 becomes open. Therefore, an open circuit in the incandescent lamp 101, 102 is detected based on the variation in the output level of the comparator 103.

Light emitting diodes (LEDs) have better power saving performance than incandescent lamps. Therefore, application of LEDs to indicator systems for vehicles has been examined in the recent years. One of such systems is proposed in JP-A-2002-76439. A single LED cannot provide sufficient brightness for direction indication. Thus, multiple LEDs are arranged in lines and used for each indicator to provide desired brightness. Open-circuit detection can be performed in this system in the same manner as the indicator system shown in FIG. 11.

Figure 10:
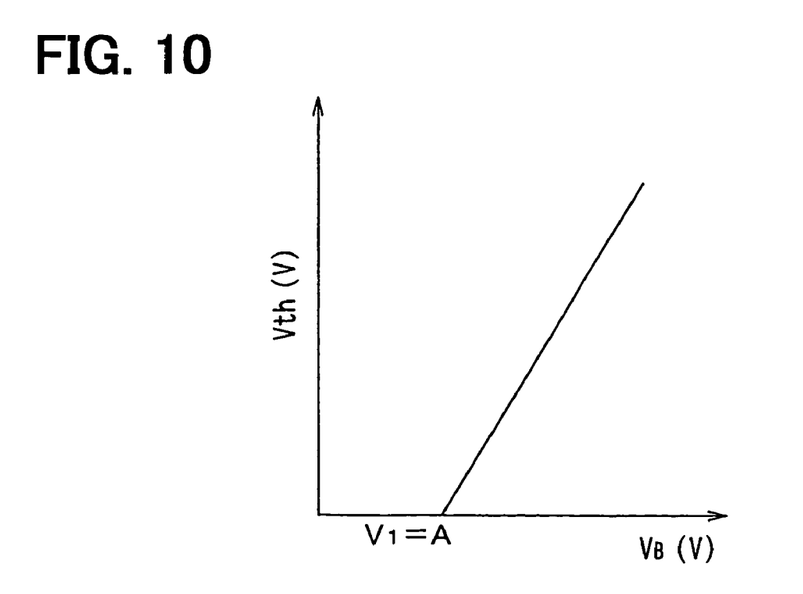
FIG. 10 is a graph showing a relationship between the battery voltage and a threshold voltage according to the third embodiment.

However, a voltage drop at each LED varies from LED to LED and the voltage drop $V_{R80}$ at the resistor R80 varies due to a variation in voltage drops at the LEDs. A relationship between the battery voltage $V_B$ and the voltage drop $V_{R80}$ under normal conditions is shown in FIG. 10. The variation in the voltage drop $V_{R80}$ due to the variation in the LED is also shown in FIG. 10.

A middle of a range of the variation in the voltage drop $V_{R80}$ is determined based on an average voltage drop of LEDs and indicated with line L10. When the voltage drop at the LED 110 is smaller than the average, a battery voltage-voltage drop characteristic curve shifts from line L10 to the left side of the graph. The battery voltage-voltage drop characteristic curve shifts from line L10 to the right side of the graph when the voltage drop at the LED 110 is larger than the average. The characteristic curve shifts between the maximum line and the minimum line. The maximum line and the minimum line indicate the battery voltage-voltage drop characteristic in conditions that the voltage drop at the LED 110 is the largest and the smallest, respectively.

Figure 12:
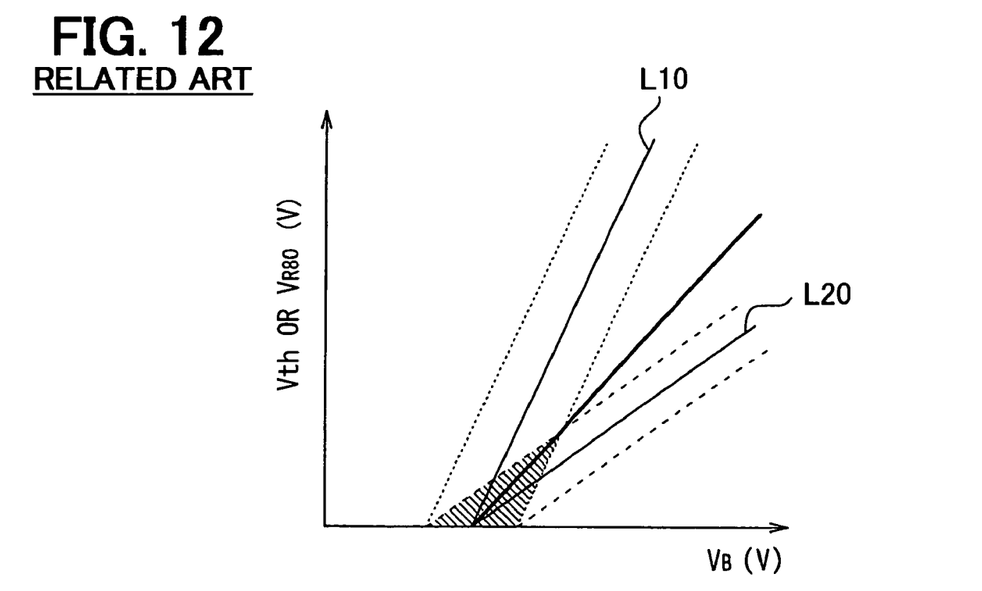
FIG. 12 is a graph showing relationships between the battery voltage, a threshold voltage, and a voltage drop at a shunt resistor according to the related art.

A relationship between the battery voltage $V_B$ and the voltage drop $V_{R80}$ under abnormal conditions is also shown in FIG. 12. A middle of a range of the variation in the voltage drop $V_{R80}$ is determined based on an average voltage drop of LEDs and indicated with line L20. A battery voltage-voltage drop characteristic curve shifts in the same manner as the normal conditions. The maximum line and the minimum line are also provided for this case.

If the voltage drop at the LED 110 is larger than the average and the battery voltage $V_B$ is low, the characteristic curve shifts more to the right than line L10. As a result, an open circuit is improperly determined even when it does not actually exist. If the voltage drop is smaller than the average and the battery voltage $V_B$ is low, the characteristic curve shifts more to the left than line L10. As a result, an open circuit is not determined even when is actually exist. Namely, improper open-circuit determination occurs in an area indicated with shade in the graph.

SUMMARY OF THE INVENTION

The present invention therefore has an objective to provide an indicator system having multiple LEDs and an open-circuit detecting function that provides accurate open-circuit detection. An indicator system of the present invention includes LED indicators, a flashing switch, a flashing control circuit, an open-circuit detecting circuit, a low-voltage filtering circuit, and a flashing control circuit. Each LED indicator has multiple LED lines in which LEDs are arranged. The LED lines are connected in parallel to each other. The LEDs illuminates when power is supplied from a power source.

The flashing switch is connected between the power source and the LED indicators for controlling power supply from the power source to the LED indicators so that the power indicators turn on and off. The flashing control circuit controls the on/off operation of the flashing switch after an indicator switch is closed for turning on one of the LED indicators. The open-circuit detecting circuit detects disconnection in at least one of the LED lines by converting the current from the power source to the LED indicator into a voltage and compares the voltage with a threshold voltage. Then, it outputs the result of comparison to the low-voltage filtering circuit.

The low-voltage filtering circuit filters out a signal indicating an open-circuit if a source voltage is lower than a predetermined level. The flashing control circuit receives the result of open-circuit detection from the open-circuit detecting circuit via the low-voltage filtering circuit. It controls on/off operation of the flashing switch if the source voltage is higher than the predetermined level. More specifically, it controls the flashing switch so that the indicators flash in different manners based on whether an open circuit is detected.

Since the signal indicating an open-circuit is not transmitted to the flashing control circuit if the source voltage is lower than a predetermined level, improper control of the flashing switch is less likely to be performed. Namely, erroneous open-circuit determination is less likely to be made when an open-circuit is not actually present and an open-circuit is properly determined when an open-circuit is actually present.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

The preferred embodiments of the present invention will be explained with reference to the accompanying drawings. In the drawings, the same numerals are used for the same components and devices.

[First Embodiment]

Figure 1:
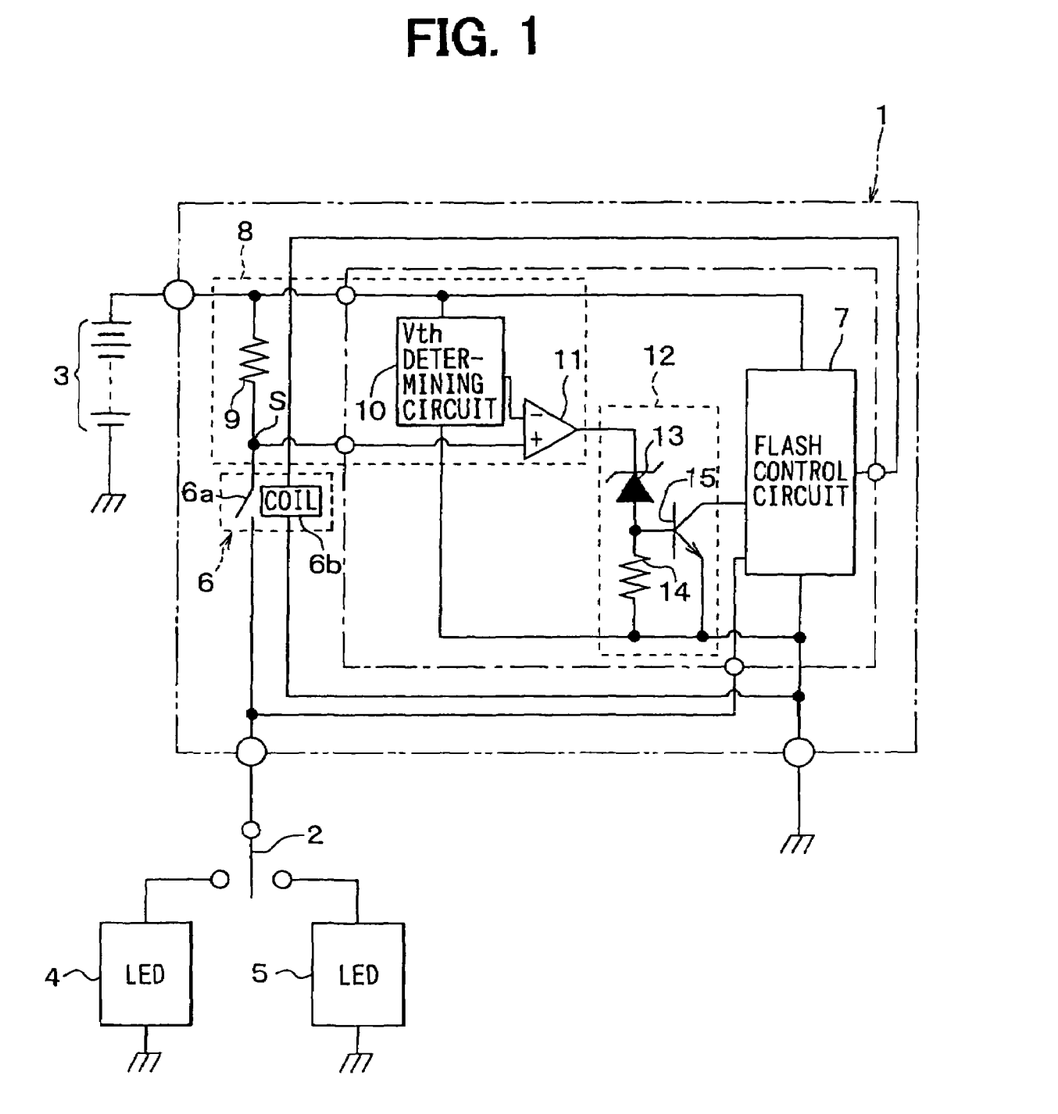
FIG. 1 is a circuit diagram of an indicator system according to the first embodiment of the present invention.

Referring to FIG. 1, an indicator system includes an indicator control unit 1, an indicator switch 2, a battery 3, a left LED indicator 4, and a right LED indicator 5. The indicator control unit 1 controls illumination of the left indicator 4 and the right indicator 5. It turns on the left indicator 4 or the right indicator 5, whichever selected by a driver through operation of the indicator switch 2 and supplied with power from the battery 3. The indicator switch 2 is arranged behind a steering wheel inside a vehicle.

Figure 2:
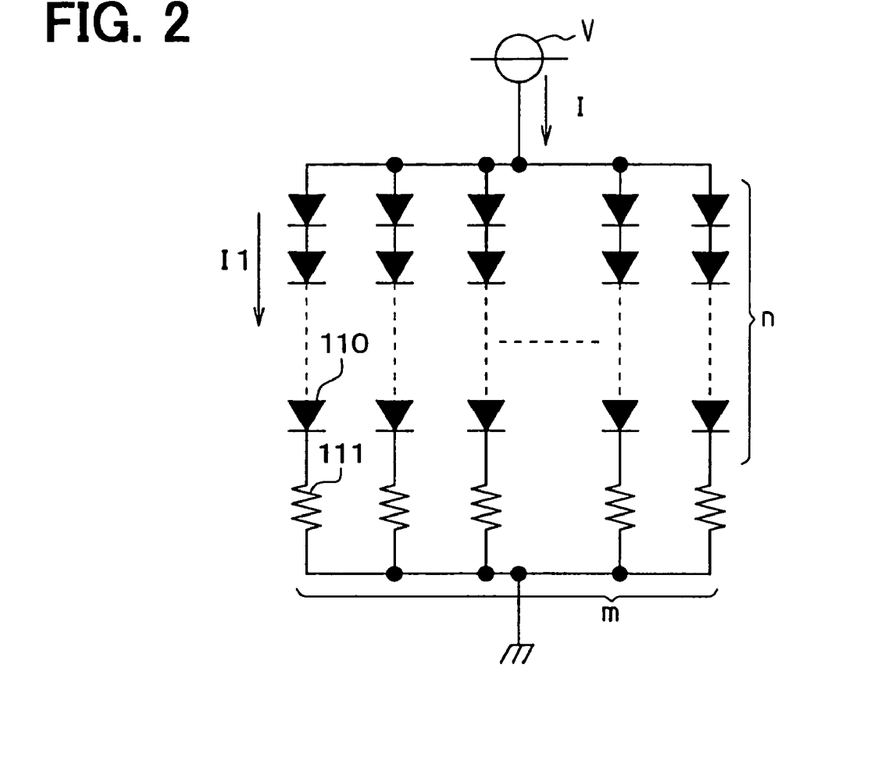
FIG. 2 is a circuit diagram of a light emitting diode indicator according to the first embodiment.

Each indicator 4, 5 is constructed of multiple LEDs 110 and resistors as shown in FIG. 2. An n number of LEDs 110 and a resistor 111 are connected in series. This series circuit is referred to as an LED line. An m number of LED lines are connected in parallel with each other. The indicator 4, 5 flashes when power is supplied from the battery 3 to each LED line via the indicator control unit 1 and the indicator switch 2. Although only one for each Indicator 4, 5 is shown in FIG. 1, two of each Indicator 4, 5 are arranged at the front end and the rear end. Another pair of Indicators 4, 5 can be provided on sides of the vehicle as necessary. The indicator control unit 1 controls the Indicators 4, 5 so that the Indicators 4, 5 at the front end and the rear end flash simultaneously.

When an open circuit is detected in the Indicators 4, 5, the indicator control unit 1 controls the Indicators 4, 5 to flash in different manner. More specifically, the indictor control unit 1 shortens flashing intervals of the Indicators 4, 5 to notify the driver of the open-circuit.

When the indicator switch 2 is connected with one of the indicators 4, 5, a voltage is applied to the Indicator 4, 5 and current I1 flows through each LED line. The amount of the current I1 is expressed by the following equation:

$$I1=(V-n \times Vf)/R \tag{1}$$

where V is an input voltage of the Indicator 4, 5, Vf is a voltage drop at each LED 110, and R is resistance of the resistor 111. Current I flowing into the indicator unit is expressed by the following equation:

$$I=m \times I1 \tag{2}$$

The current I is calculated by substituting the equation (1) in the equation (2):

$$I=m \times R \times (V-n \times Vf) \tag{3}$$

Figure 3:
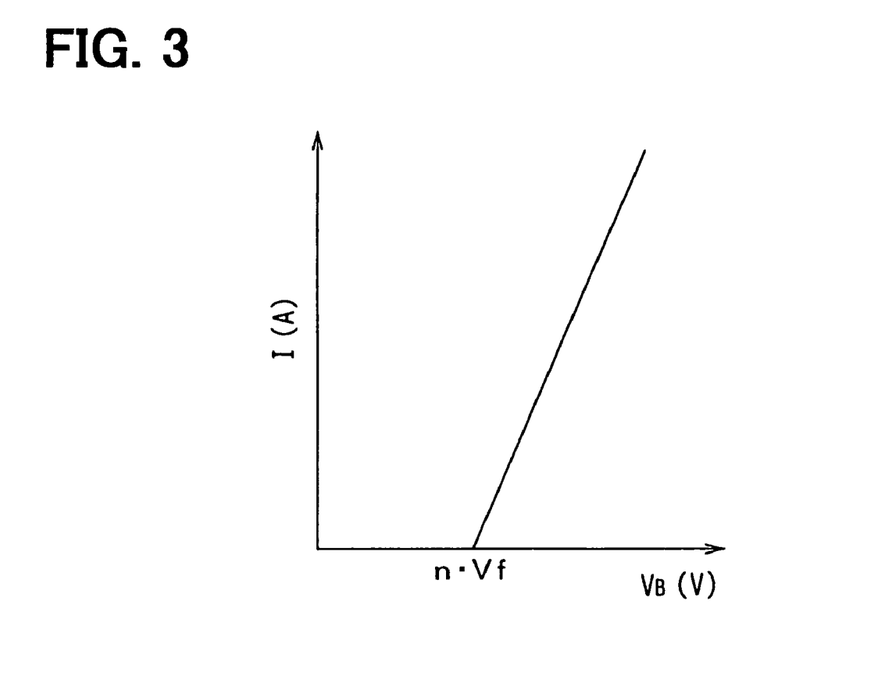
FIG. 3 is a graph showing a relationship between a battery voltage and a current flowing into the light emitting diode indicator according to the first embodiment.

The current I varies according to the input voltage V, that is, a battery voltage $V_B$ of the battery 3, as shown in FIG. 3. When the input voltage V is higher than a total voltage drop at the n number of LEDs, the current I1 flows through each LED line and LEDs 110 illuminate.

The indicator control unit 1 includes a flashing relay 6, a flashing control circuit 7, an open-circuit detecting circuit 8, and a low-voltage filtering circuit 12. The flashing relay 6, which functions as a flashing switch, is a regular relay having a relay contact 6a and a coil 6b that pulls the relay contact 6a when energized. It electrically connects the left Indicator 4 or the right Indicator 5, whichever connected with the flashing relay 6 via the indicator switch 2, to the battery 3. Namely, it controls power supply from the battery 3 to the Indicator 4, 5 by switching the relay contact 6a between open and closed positions. When the coil 6b is energized and the relay contact 6a is pulled to the coil 6b, the Indicator 4, 5 is electrically connected to the battery 3 and power is supplied.

The flashing control circuit 7 detects closure of the indicator switch 2 based on a voltage at a point between the indicator switch 2 and the flashing relay 6. It determines start timing of power supply from the battery 3 to the coil 6b and starts the power supply at that timing when the closure of the indicator switch 2 is detected. A signal indicating an open-circuit is inputted to the flashing control circuit 7 from the open-circuit detecting circuit 8 and the flashing control circuit 7 controls the power supply timing based on the signal.

If no open-circuit signal is inputted to the flashing control circuit 7, it outputs a pulse voltage for blinking the Indicator 4, 5 at the first intervals. If the open-circuit signal is inputted to the flashing control circuit 7, it outputs a pulse voltage for blinking the Indicator 4, 5 at the second intervals that are shorter than the first intervals.

The open-circuit detecting circuit 8 includes a shunt resistor 9 for current detection, a threshold determining circuit 10, and a voltage comparator 11. The open-circuit detection circuit 8 detects an open-circuit, or a disconnection, in the multiple LED lines of the Indicators 4, 5. If at least one of LED lines becomes open, an open-circuit is detected and a signal indicating an open-circuit is outputted to the flashing control circuit 7.

The shunt resistor 9 functions as a current-to-voltage converter for converting current flowing in a power supply line to a voltage. The power supply line is provided for supplying power from the battery 3 to the LED indicator 4, 5. The shunt resistor 9 is connected in series between the battery 3 and the Indicator 4, 5 for measuring the amount of current flowing through the power supply line. A voltage across the shunt resistor 9 varies according to the amount of current. Thus, the amount of current can be determined based on a voltage drop at the shut resistor 9. A voltage $V_S$ at a point S between the shunt resistor 9 and the flashing relay 6 is inputted to the voltage comparator 11 and compared with a threshold voltage Vth. The voltage $V_S$ is an indicator voltage determined by converting current flowing from the battery 3 to the LED indicator 4, 5 to a voltage. The open-circuit is determined based on a result of the comparison.

The threshold determining circuit 10 determines the threshold voltage $V_{th}$ used for the open-circuit detection and inputs the determined threshold voltage $V_{th}$ to the voltage comparator 11. The open-circuit detecting circuit 8 determines the number of open LED lines based on the threshold voltage $V_{th}$. Namely, the number of LDE lines determined as open varies according to a level of the threshold voltage $V_{th}$. The threshold determining circuit shown in FIG. 11 can be applied to the threshold determining circuit 10 and therefore the configuration of the threshold determining circuit 10 will not be discussed.

The voltage comparator 11 compares the voltage at point S, which indicates the amount of voltage dropped at the shunt resistor 9, with the threshold voltage $V_{th}$. The voltage comparator 11 outputs a low level signal that indicates that no open-circuit is detected in the Indicator 4, 5 when the voltage at point S is larger than the threshold voltage $V_{th}$. It outputs a high level signal that indicates that an open-circuit is detected in the Indicator 4, 5 when the voltage is smaller than the threshold voltage $V_{th}$. The battery voltage $V_B$ is inputted to the comparator 11. The comparator 11 outputs a ground voltage as a low-level signal and the battery voltage $V_B$ as a high-level signal.

The low-voltage filtering circuit 12 includes a zener diode 13, a resistor 14, and an NPN bipolar transistor 15. The output voltage of the comparator 11 is applied to the zener diode 13 and a voltage at a point between the zener diode 13 and the resistor 14 is applied to the base of the transistor 15. The collector of the transistor 15 is connected to the flashing control circuit 7. The collector current of the transistor 15 is inputted to the flashing control circuit 7 so that the flashing control circuit 7 can determine a level of collector voltage.

When the driver turns the indicator switch 2 to the left Indicator position or the right Indicator position, the flashing relay 6 and the indicator switch 2 are connected to a ground terminal GND via the Indicator 4, 5. A signal indicating the establishment of this connection is inputted to the flashing control circuit 7. The flashing control circuit 7 detects the closure of the indicator switch 2 based on this signal and starts power supply from the battery 3 to the coil 6b.

The comparator 11 compares the voltage $V_S$ with the threshold voltage $V_{th}$ and outputs a signal, a level of which corresponds to the result of the comparison. If the LED lines become open, the amount of current in the power supply line decreases by the amount of current that flowed through the open LED line. As a result, the amount of voltage dropped at the shunt resistor 9, that is, the voltage $V_S$, becomes smaller as the number of open LED lines increases, and it eventually becomes smaller than the threshold voltage $V_{th}$.

When the number of open LED lines is smaller than the number detectable by the open-circuit detecting circuit 8, the voltage $V_S$ is higher than the threshold voltage $V_{th}$. Thus, the comparator 11 outputs a low-level signal indicating that no open circuit is detected. In this case, a voltage lower than a breakdown voltage is applied to the zener diode 13 and the zener diode 13 inhibits current from flowing through it. Therefore, the transistor 15 does not turn on, the collector voltage remains high, and the comparison result is not transmitted to the flashing control circuit 7. Namely, the zener diode 13 inhibits the transmission of the comparison result to the flashing control circuit 7.

The flashing control circuit 7 determines that no open-circuit is present because the collector voltage has not become low and applies the first interval pulse voltage to the coil 6b. As a result, the Indicator 4 or 5, whichever selected by the driver, flashes at the first intervals.

When the number of open LED lines reaches the number detectable by the open-circuit detecting circuit 8, the voltage $V_S$ becomes smaller than the threshold voltage $V_{th}$. Thus, the comparator 11 outputs a high-level signal indicating that an open circuit is detected. Since the high-level signal is equal to the battery voltage $V_B$, the transistor 15 turns on when the battery voltage $V_B$ is higher than the breakdown voltage of the zener diode 13.

If the battery voltage $V_B$ is higher than the breakdown voltage, current flows through the zener diode 13 and the resistor 14. As a result, the transistor 15 turns on and current flows from the collector to the emitter. The collector voltage becomes approximately equal to the ground voltage. Namely, a low-level signal is inputted to the flashing control circuit 7. The flashing control circuit 7 determines that an open-circuit is present and applies the second interval pulse voltage to the coil 6b. As a result, the Indicator 4 or 5, whichever selected by the driver, flashes at the second intervals, which are shorter than the first intervals.

If the battery voltage $V_B$ is smaller than the breakdown voltage, a current does not flow through the zener diode 13. Therefore, the transistor 15 does not turn on and the collector voltage remains high. The flashing control circuit 7 determines that no open circuit is present because the collector voltage has not become low, and applies the first interval pulse voltage to the coil 6b. As a result, the Indicator 4, 5, whichever selected by the driver, flashes at the first intervals.

The breakdown voltage is used as a reference voltage for determining the battery voltage $V_{th}$ used in the open-circuit determination. The breakdown voltage is determined as follows.

Figure 4:
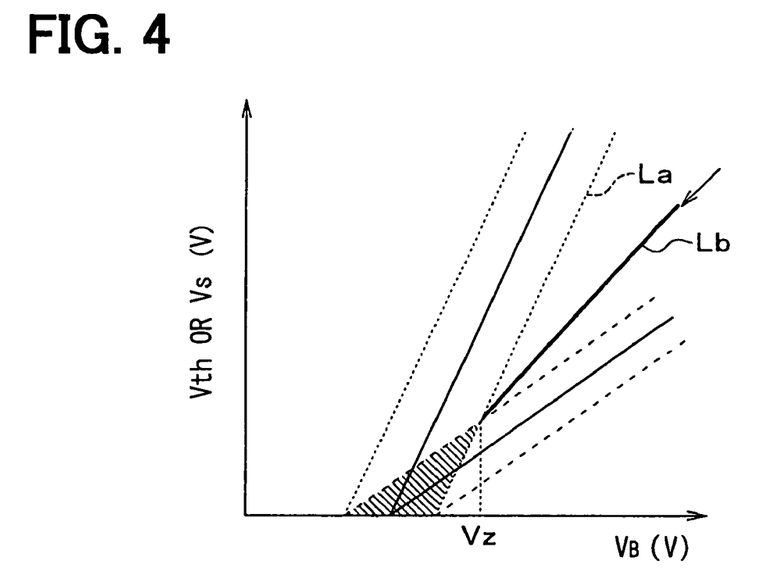
FIG. 4 is a graph showing relationships between the battery voltage, a threshold voltage, and a voltage drop at a shunt resistor according to the first embodiment.

Relationships between the breakdown voltage, the threshold voltage $V_{th}$, and the battery voltage $V_B$ and a relationship between the voltage $V_S$ and the battery voltage $V_B$ are shown in FIG. 4. A battery voltage-threshold voltage characteristic curve shifts according to the voltage drops Vf at the LEDs 110. When the voltage drop Vf is the maximum in the range, the voltage $V_S$ becomes the minimum. Line $L_a$ is a battery voltage-indicator voltage characteristic curve that indicates a relationship between the battery voltage $V_B$ and the indicator voltage $V_S$ when the indicator voltage $V_S$ is at the minimum.

Line $L_b$ is a battery voltage-threshold voltage curve that indicates a relationship between the battery voltage $V_B$ and the threshold voltage $V_{th}$. The indicator voltage $V_S$ agrees with the threshold voltage $V_{th}$ at an intersection point of the two lines $L_a$ and $L_b$. When the battery voltage $V_B$ at the intersection is $V_Z$ and it becomes smaller than $V_Z$, improper open-circuit determination occurs. Therefore, the breakdown voltage is set in a range between the voltage $V_Z$ and the minimum operating voltage that is the minimum level of the battery voltage $V_B$ required for proper execution of the open-circuit detection.

The result of the open-circuit detection is not inputted to the flashing control circuit 7 when the battery voltage $V_B$ is lower than the breakdown voltage, which is set higher than the voltage $V_Z$. Thus, an open circuit is less likely to be determined when it is not actually present or an open circuit is not detected when it is actually present. Namely, open circuit determination is accurately and properly performed.

[Second Embodiment]

Figure 5:
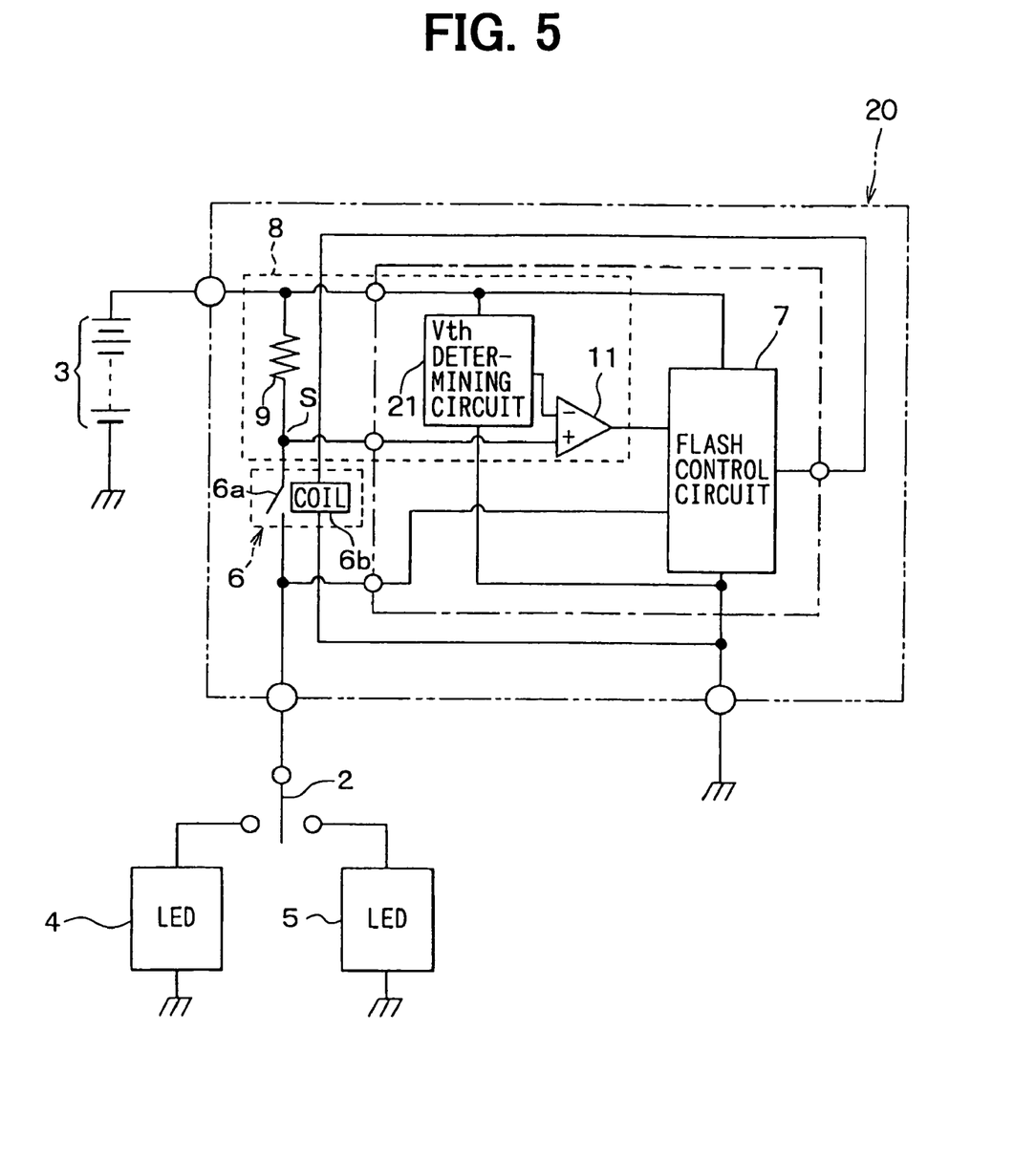
FIG. 5 is a circuit diagram of an indicator system according to the second embodiment of the present invention.

Referring to FIG. 5, an indicator control unit 20 has a similar configuration to that of the first embodiment. The low-voltage filtering circuit 12 is not included in this indicator control unit 20. Moreover, a threshold voltage determining circuit 21 is included instead of the threshold voltage determining circuit 10. Other components and circuits are the same as those in the first embodiment. Therefore, they will not be discussed in this second embodiment section.

Figure 6:
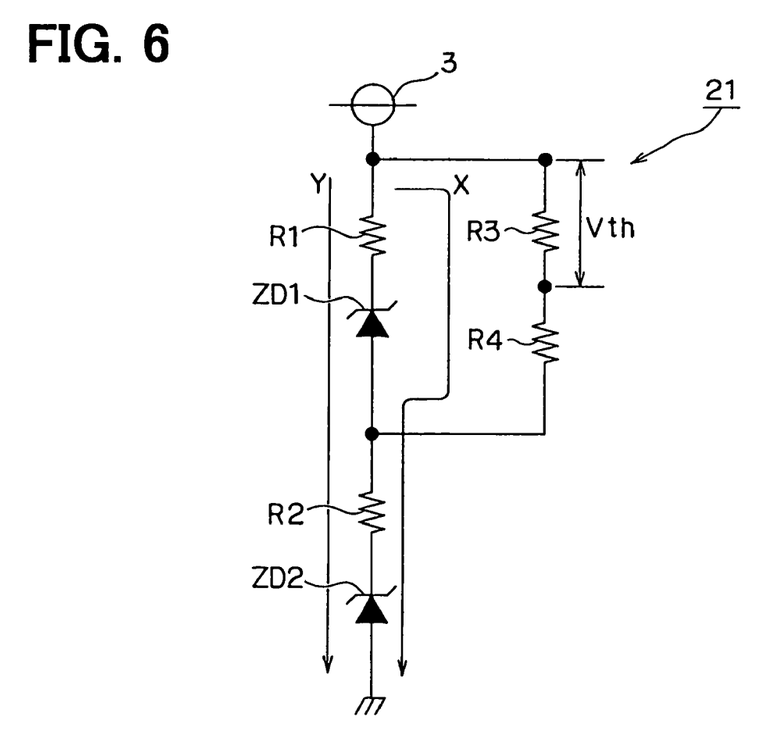
FIG. 6 is a circuit diagram of a threshold determining circuit included in the indicator system according to the second embodiment.

The threshold determining circuit 21 shown in FIG. 6 is connected between the battery 3 and the ground. It includes the first, the second, the third and the fourth resistors R1, R2, R3, R4, and the first and the second zener diode ZD1, ZD2. The first resistor R1, the first zener diode ZD1, the second resistor R2, and the second zener diode ZD2 are connected in series in this order from the battery 3. The third resistor R3 and the fourth resistor R4 are connected in series and they are connected in parallel to the first resistor R1 and the first zener diode ZD1.

When the battery voltage $V_B$ is lower than the first predetermined level, which is a breakdown voltage of the second diode ZD2, the second diode ZD2 does not allow current to flow through this circuit 21. When the battery voltage $V_B$ is higher than the breakdown voltage but lower than a sum of voltages of the first diode ZD1 and the second diode ZD2, the current flows from the battery 3 to the ground via the third resistor R3, the fourth resistor R4, the second resistor R2, and the second diode ZD2. This current flow is indicated with an arrow X in FIG. 6.

The threshold voltage $V_{th}$ is calculated from the battery voltage, the breakdown voltage of the second diode ZD2, and resistances of the second, the third, and the fourth resistors R2, R3, R4. More specifically, the breakdown voltage is subtracted from the battery voltage $V_B$ and the subtracted voltage is divided the resistances of the second, the third, and the fourth resistors R2, R3, R4. The voltage across the third resistor R3 is set as the threshold voltage $V_{th}$. Since the current flowing through the third resistor R3 varies according to a variation in the battery voltage $V_B$, the threshold voltage $V_{th}$ increases with the first gradient as the battery voltage $V_B$ increases.

When the battery voltage $V_B$ is higher than the second predetermined level, the current also flows from the battery 3 to the ground via the first resistor R1, the first zener diode ZD1, the second resistor R2, and the second zener diode ZD2. This current flow is indicated with an arrow Y in FIG. 6. The second predetermined level is a sum of the breakdown voltages of the first and the second zener diodes ZD1, ZD2. A larger amount of current flows through the resistor R2 and the voltage drop at the resistor R2 increases. As a result, voltage at a point between the fourth resistor R4 and the second resistor R2 becomes higher and the voltage across the third resistor R3 and the fourth resistor R3 becomes lower.

Figure 7A:
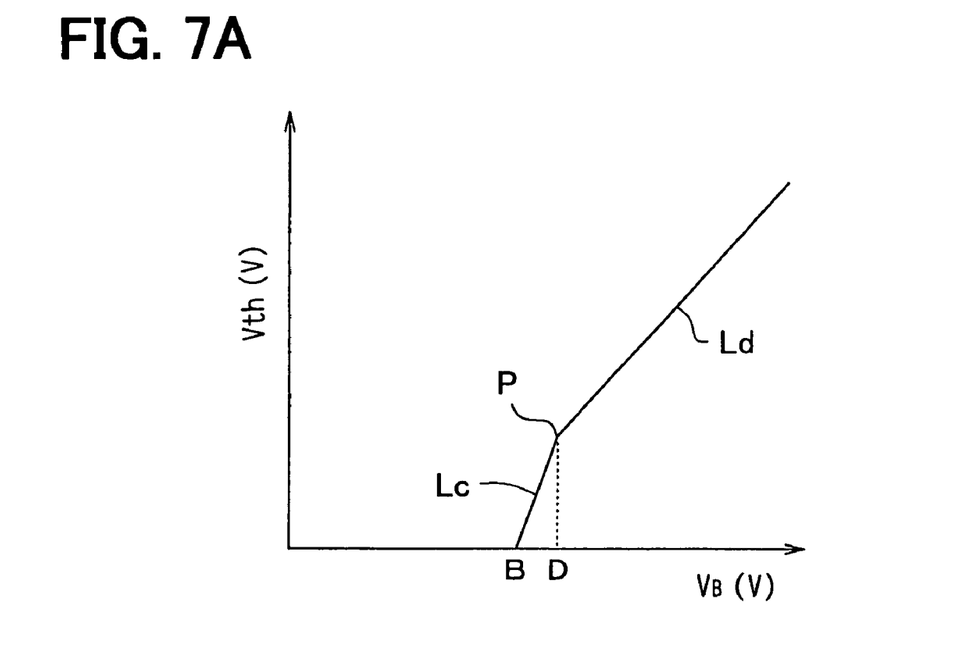
FIG. 7A is a graph showing a relationship between a battery voltage and a threshold voltage according to the second embodiment of the present invention.

When the current flows in both paths X and Y, the amount of current flowing through the third resistor R3 is smaller in comparison with the case that the current flows only in path X. The threshold voltage $V_{th}$ determined by the voltage across the third resistor R3 increases with the second gradient, which is smaller than the first gradient, as the battery voltage $V_B$ increases. As shown in FIG. 7A, the gradient of the characteristic curve of the threshold voltage $V_B$ versus the battery voltage $V_B$ changes from the first gradient to the second gradient at point P, where the battery voltage $V_B$ is the second predetermined level.

Figure 7B:
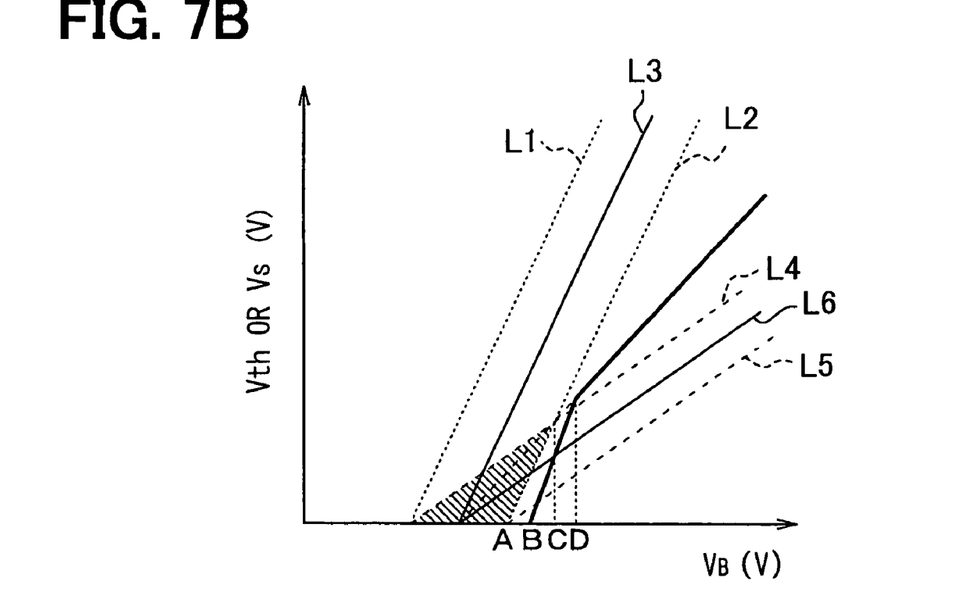
FIG. 7B is a graph showing relationships between the battery voltage, the threshold voltage, and a voltage drop at a shunt resistor.

Relationships between the battery voltage $V_B$, the threshold voltage $V_{th}$, and the indicator voltage $V_S$ are shown in FIG. 7B. The indicator voltage $V_S$ varies according to the battery voltage $V_B$. A range of the variation in the indicator voltage $V_S$ under normal conditions is indicated with line L1 and line L2. Lines L1 and L2 indicate the variation in the indicator voltage $V_S$ under the conditions that the voltage drops at the LEDs 110 are at the maximum and the minimum, respectively. A middle of this normal range is indicated with line L3. When an open circuit occurs, the indicator voltage $V_S$ varies in a range indicated with lines L4 and L5. Lines L4 and L5 indicate variation in the indicator voltage $V_S$ in a case that the voltage drop at the LEDs 110 are at the minimum and the maximum, respectively. A meddle of this abnormal range is indicated with line L6.

An open circuit is improperly detected in an area defined by lines L2, L4, and the x-axis. This area is indicated with shade in FIG. 7B. The threshold voltage Vth is determined outside this area so that the indicator voltage $V_S$ in this area is excluded from the open-circuit detection.

An intersection point B of line $L_c$ and an x-axis, that is, a point at which line $L_c$ of the threshold voltage $V_{th}$ becomes zero, indicates the breakdown voltage of the second zener diode ZD2. Namely, the breakdown voltage is set so that the point B is set to a desired point on the x-axis. The point B is preferable to be set between point A and point C. Point A is an intersection point of line L and the x-axis, and point C is a point on the x-axis corresponding to an x-component of an intersection point of line and line $L_d$.

Point D on the x-axis corresponding to an x-component of an intersection point of line $L_c$ and line $L_d$ is the breakdown voltage of the second zener diode ZD2. The breakdown voltage of the first zener diode ZD1 is determined so that point D is set to a desired point. Point D is preferable to be set to a point larger than point C but smaller than the minimum operating voltage. The minimum operation voltage is the minimum battery voltage required for execution of the open-circuit detection.

With the above configuration, the threshold voltage Vth is set so that improper open-circuit determination is less likely to be made. Furthermore, an open-circuit is detected when the indicator voltage $V_S$ falls in a range defined by points B, D, and P.

[Third Embodiment]

Figure 8:
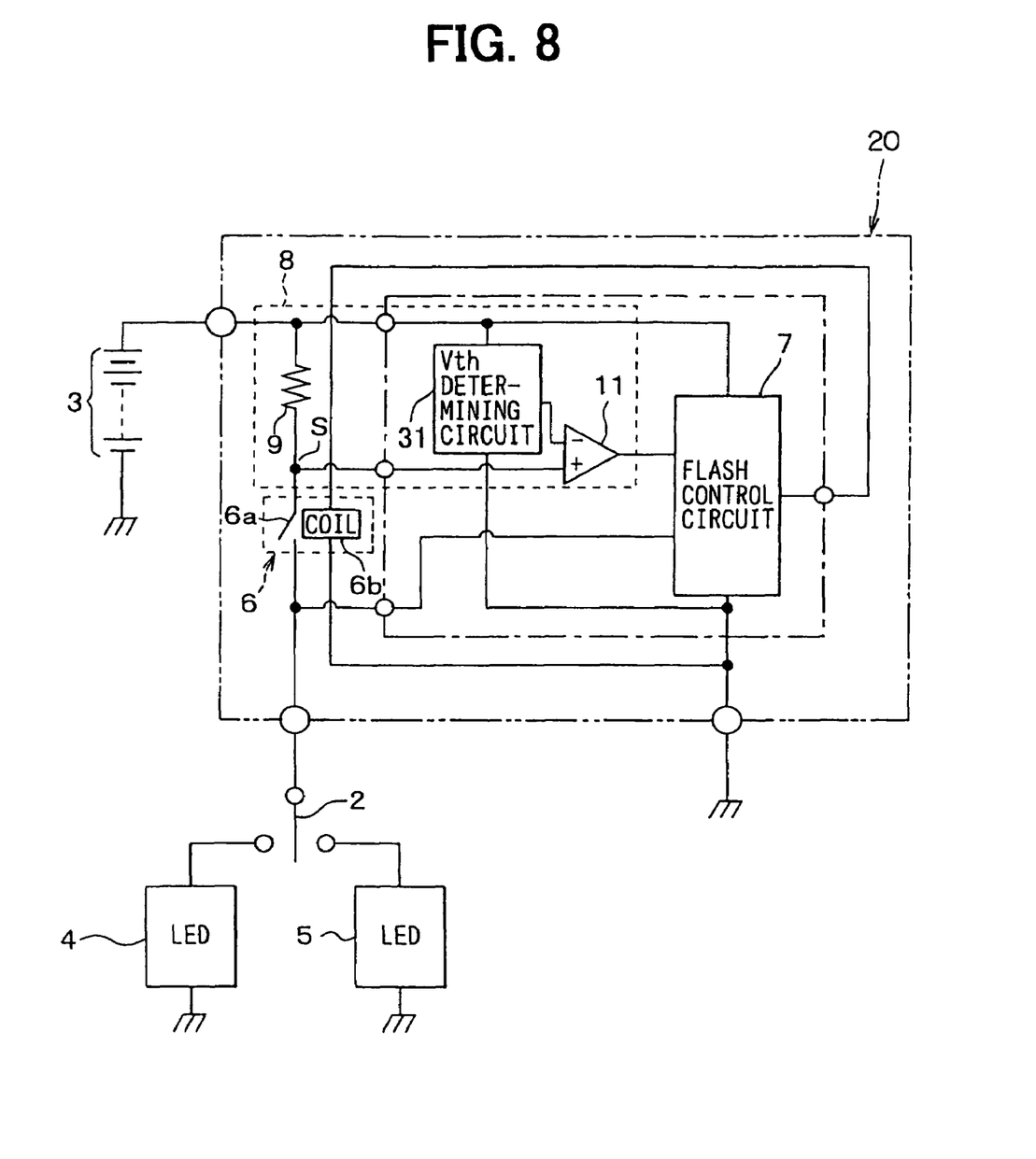
FIG. 8 is a circuit diagram of an indicator system according to the third embodiment of the present invention.
Figure 9:
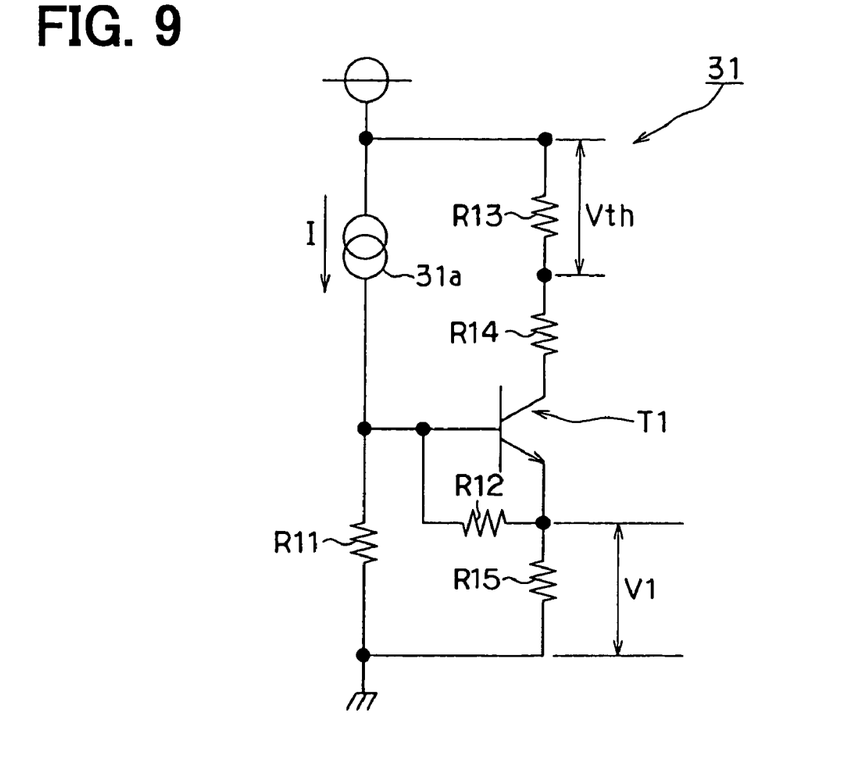
FIG. 9 is a circuit diagram of a threshold determining circuit included in the indicator system according to the third embodiment.

Referring to FIGS. 8, 9, the threshold determining circuit 31 includes a constant current source 31a, the first through the fifth resistors R11–R15, and an NPN bipolar transistor T1. The first resistor R11 is connected in series with the battery 3 and with the ground. The constant current source 31a and the resistor R11 form a constant voltage section. A voltage at a point between the constant current source 10a and the first resistor R11, namely, a constant voltage developed by the constant current flowing through the resistor R11, is applied to the base of the transistor T1.

The second resistor R12 is connected between the base and the emitter of the transistor T1. The third and the fourth resistors R13, R14 are connected in series between the collector of the transistor T1 and the battery 3. The fifth resistor R15 is connected between the emitter and the ground. The voltage drop at the third resistor R13, which is measured at a point between the third resistor R13 and the fourth resistor R14, is set as a threshold voltage $V_{th}$ inputted to the voltage comparator 11.

A voltage $V_1$ across the fifth resistor R15 is equal to a difference between a base voltage of the transistor T1 and a voltage drop at the second resistor R12, that is, a voltage across the second resistor R12. The voltage across the second resistor R12 is equal to a base-emitter voltage $V_{be}$ of the transistor T1. Since current flowing to the resistor R12 and the base of the transistor T1 is very small, the almost all amount of the current I flows through the first resistor R11. Thus, the voltage $V_1$ is expressed by the following equation:

$$V_1 \approx I \times R_{11} - V_{be} \qquad (4)$$

where $R_{11}$ is a resistance of the first resistor R11.

The equation shows that the voltage $V_1$ across the fifth resistor 15 depends on the resistance $R_{11}$ of the first resistor R11. Since current flowing through the fifth resistor R15 is determined by dividing the voltage $V_1$ by a resistance of the fifth resistor R15, the current is also determined based on the resistance $R_{11}$. The threshold voltage $V_{th}$, which is a voltage across the resistor R13, is also determined based on the resistance R11 because it is influenced by the voltage $V_1$.

A battery voltage-threshold voltage characteristic curve that indicates a relationship between the battery voltage $V_B$ and the threshold voltage $V_{th}$ is shown in FIG. 10. An intersection point A of the characteristic curve and the x-axis can be shifted by adjusting the resistance $R_{11}$ of the first resistor R11.

When a zener diode is used in the threshold determining circuit, the adjustment of the threshold voltage Vth is limited by a standardized breakdown voltage of the zener diode. With the above configuration, the threshold voltage Vth can be adjusted based on the resistance $R_{11}$. This threshold determining circuit 31 can flexibly sets the threshold voltage $V_{th}$ for different Indicators even when LEDs used in the indicators produce different voltage drops or the number of LEDs are different from indicator to indicator. As a result, the versatility of the indicator control unit improves. Moreover, the accuracy of the open-circuit detection improves because the threshold voltage $V_{th}$ is precisely adjusted.

The present invention should not be limited to the embodiment previously discussed and shown in the figures, but may be implemented in various ways without departing from the spirit of the invention. For example, the breakdown voltage $V_Z$ of the zener diode 13 may be set equal to the battery voltage $V_B$ at the intersection point of line $L_b$ and a line of the battery voltage $V_B$ versus the maximum indicator voltage $V_S$ in an open-circuit condition. The breakdown voltage $V_Z$ may be set to the battery voltage $V_B$ at an intersection of lines $L_a$ and $L_b$ or at the above-described point, whichever is larger.

A semiconductor switch may be used for a flashing switch. The indicator unit 1 can be applied to an indicator used at a crossing gate for indicating the approach of a train or a traffic light.

What is claimed is:

1. An indicator system comprising:
   an light emitting diode indicator having a plurality of electrically connected lines of light emitting diodes that emit light when power is supplied, wherein the lines are arranged in parallel to each other;
   a flashing switch for turning on and off power supply from a power source to the light emitting diode indicator;
   a flashing control circuit for controlling open and closure of the flashing switch after the light emitting diode indicator is turned on through an operation of an indicator switch;
   an open-circuit detecting circuit for detecting an open circuit in at least one of the lines of light emitting diodes through a comparison between a threshold voltage and an indicator voltage converted from current flowing from the power source to the light emitting diode indicator; and
   a low-voltage filtering circuit for filtering out results of the comparison if a power source voltage is smaller than a predetermined level.

2. The indicator system according to claim 1, wherein the predetermined level corresponds to a level of the power source voltage at which the indicator voltage agrees with the threshold voltage.

3. The indicator system according to claim 1, wherein:
   the open-circuit detecting circuit includes a voltage comparator that operates based on the power source voltage and compares the indicator voltage with the threshold voltage;
   the voltage comparator outputs the power source voltage as a high level signal for indicating that the indicator voltage is lower than the threshold voltage; and
   the low-voltage filtering circuit filters out the results of the comparison made in a condition that a level of the high level signal is lower than the predetermined level.

4. The indicator system according to claim 3, wherein:
   the low-voltage filtering circuit includes a zener diode to which an output voltage of the comparator is applied;
   the zener diode passes current when a level of an output signal of the comparator is higher than a breakdown voltage of the zener diode and allows transmission of the comparison results to the flashing control circuit; and
   the zener diode inhibits the current from flowing when the level of the output signal is lower than the breakdown voltage and inhibits the transmission of the comparison results to the flashing control circuit.

5. An indicator system comprising:
   an light emitting diode indicator having a plurality of electrically connected lines of light emitting diodes that emit light when power is supplied, wherein the lines are arranged in parallel to each other;
   a flashing switch for turning on and off power supply from a power source to the light emitting diode indicator;
   a flashing control circuit for controlling open and closure of the flashing switch after the light emitting diode indicator is turned on through an operation of an indicator switch; and
   an open-circuit detecting circuit for detecting an open circuit in at least one of the lines of light emitting diodes through a comparison between a threshold voltage and a power source-indicator voltage converted from current flowing from the power source to the light emitting diode indicator, wherein
   the open-circuit detecting circuit includes a current-to-voltage converting circuit for converting current flowing from the power source to the light emitting indicator to a voltage, an open-circuit detection threshold determining circuit for determining the threshold voltage, and a comparator for determining an open circuit by comparing the voltage converted by the current-to-voltage converting circuit with the threshold voltage, and the open-circuit detection threshold determining circuit determines the threshold voltage to vary at a first rate as the power source voltage varies between a first predetermined level to a second predetermined level that is higher than the first predetermined level, and at a second rate as the power source voltage increases from the second predetermined level.

6. The indicator system according to claim 5, wherein the first predetermined level is equal to a level of the power source voltage corresponding to an amount of voltage drop at the light emitting diode indicator, the light emitting diodes of which produce a maximum level of voltage drop when illuminated.

7. The indicator system according to claim 5, wherein the second predetermined level corresponds to a level of the power source voltage at which a voltage converted from current by the current-to-voltage converting circuit agrees with the threshold voltage that varies at the second rate.

8. The indicator system according to claim 5, wherein the second rate is lower than the first rate.

9. An indicator system comprising:
an light emitting diode indicator having a plurality of electrically connected lines of light emitting diodes that emit light when power is supplied, wherein the lines are arranged in parallel to each other;
a flashing switch for turning on and off power supply from a power source to the light emitting diode indicator;
a flashing control circuit for controlling open and closure of the flashing switch after the light emitting diode indicator is turned on through an operation of an indicator switch; and
an open-circuit detecting circuit for detecting an open circuit in at least one of the lines of light emitting diodes, wherein the open-circuit detecting circuit includes a current-to-voltage converting circuit for converting current flowing from the power source to the light emitting diode indicator to a voltage, a threshold determining circuit for determining a threshold voltage for open-circuit detection, and a voltage comparator for comparing the voltage converted by the current-to-voltage converting circuit with the threshold voltage for the open-circuit detection, the threshold determining circuit includes a constant voltage section constructed of a constant current source and a first resistor, and the threshold determining circuit determines the threshold based on a constant voltage produced by the constant voltage section.

10. The indicator system according to claim 9, wherein:

the threshold determining circuit includes an NPN bipolar transistor, and second, third, fourth, and fifth resistors;

the NPN bipolar transistor receives a voltage at a point between the constant current source and the first resistor at a base thereof;

the second resistor is connected between the base and an emitter of the NPN bipolar transistor;

the third and the fourth resistors are connected in series between the constant current source and a collector of the NPN bipolar transistor;

the fifth resistor is connected between the emitter of the NPN bipolar transistor and the first resistor; and the threshold determining circuit determines a voltage at a point between the third and the fourth resistors as the threshold voltage.

\* \* \* \* \*